(12) United States Patent
Sharma et al.

(10) Patent No.: US 8,494,017 B2
(45) Date of Patent: Jul. 23, 2013

(54) SOLID STATE LASER DEVICE USING A SELECTED CRYSTAL ORIENTATION IN NON-POLAR OR SEMI-POLAR GAN CONTAINING MATERIALS AND METHODS

(75) Inventors: Rajat Sharma, Goleta, CA (US); Eric M. Hall, Goleta, CA (US); Christiane Poblenz, Goleta, CA (US); Mark P. D'Evelyn, Goleta, CA (US)

(73) Assignee: Soraa, Inc., Fremont, CA (US)

( * ) Notice: Subject to any disclaimer, the term of this patent is extended or adjusted under 35 U.S.C. 154(b) by 0 days.

(21) Appl. No.: 13/606,894

(22) Filed: Sep. 7, 2012

(65) Prior Publication Data

US 2013/0064261 A1 Mar. 14, 2013

Related U.S. Application Data

(63) Continuation of application No. 12/534,838, filed on Aug. 3, 2009, now Pat. No. 8,284,810.

(60) Provisional application No. 61/086,142, filed on Aug. 4, 2008.

(51) Int. Cl.
*H01S 5/00* (2006.01)

(52) U.S. Cl.
USPC ............... 372/44.011; 257/64; 257/E29.003; 257/E33.003

(58) Field of Classification Search
USPC ........ 372/44.011; 257/64, E29.003, E33.003; 438/33
See application file for complete search history.

(56) References Cited

U.S. PATENT DOCUMENTS

| | | | |
|---|---|---|---|
| 4,341,592 A | 7/1982 | Shortes et al. | |
| 4,860,687 A | 8/1989 | Frijlink | |
| 4,911,102 A | 3/1990 | Manabe et al. | |
| 5,331,654 A | 7/1994 | Jewell et al. | |
| 5,334,277 A | 8/1994 | Nakamura | |
| 5,527,417 A | 6/1996 | Iida et al. | |
| 5,607,899 A | 3/1997 | Yoshida et al. | |
| 5,632,812 A | 5/1997 | Hirabayashi | |
| 5,647,945 A | 7/1997 | Matsuse et al. | |
| 5,821,555 A | 10/1998 | Saito et al. | |

(Continued)

FOREIGN PATENT DOCUMENTS

| | | |
|---|---|---|
| CN | 101009347 | 3/1987 |
| CN | 1538534 | 10/2004 |

(Continued)

OTHER PUBLICATIONS

Abare, 'Cleaved and Etched Facet Nitride Laser Diodes,' IEEE Journal of Selected Topics in Quantum Electronics, vol. 4, No. 3, 1998, pp. 505-509.

(Continued)

*Primary Examiner* — Yuanda Zhang
(74) *Attorney, Agent, or Firm* — Kilpatrick Townsend & Stockton LLP

(57) ABSTRACT

An edge emitting solid state laser and method. The laser comprises at least one AlInGaN active layer on a bulk GaN substrate with a non-polar or semi-polar orientation. The edges of the laser comprise {1 1–2±6} facets. The laser has high gain, low threshold currents, capability for extended operation at high current densities, and can be manufactured with improved yield. The laser is useful for optical data storage, projection displays, and as a source for general illumination.

16 Claims, 6 Drawing Sheets

U.S. PATENT DOCUMENTS

| | | | |
|---|---|---|---|
| 5,888,907 | A | 3/1999 | Tomoyasu et al. |
| 5,951,923 | A | 9/1999 | Horie et al. |
| 6,069,394 | A | 5/2000 | Hashimoto et al. |
| 6,072,197 | A | 6/2000 | Horino et al. |
| 6,153,010 | A | 11/2000 | Kiyoku et al. |
| 6,195,381 | B1 | 2/2001 | Botez et al. |
| 6,379,985 | B1 | 4/2002 | Cervantes et al. |
| 6,451,157 | B1 | 9/2002 | Hubacek |
| 6,635,904 | B2 | 10/2003 | Goetz et al. |
| 6,680,959 | B2 | 1/2004 | Tanabe et al. |
| 6,734,461 | B1 | 5/2004 | Shiomi et al. |
| 6,755,932 | B2 | 6/2004 | Masuda et al. |
| 6,809,781 | B2 | 10/2004 | Setlur et al. |
| 6,814,811 | B2 | 11/2004 | Ose |
| 6,833,564 | B2 | 12/2004 | Shen et al. |
| 6,858,081 | B2 | 2/2005 | Biwa et al. |
| 6,920,166 | B2 | 7/2005 | Akasaka et al. |
| 7,009,199 | B2 | 3/2006 | Hall |
| 7,019,325 | B2 | 3/2006 | Li et al. |
| 7,128,849 | B2 | 10/2006 | Setlur et al. |
| 7,303,630 | B2 | 12/2007 | Motoki et al. |
| 7,312,156 | B2 | 12/2007 | Granneman et al. |
| 7,358,543 | B2 | 4/2008 | Chua et al. |
| 7,390,359 | B2 | 6/2008 | Miyanaga et al. |
| 7,483,466 | B2 | 1/2009 | Uchida et al. |
| 7,489,441 | B2 | 2/2009 | Scheible et al. |
| 7,491,984 | B2 | 2/2009 | Koike et al. |
| 7,555,025 | B2 | 6/2009 | Yoshida |
| 7,598,104 | B2 | 10/2009 | Teng et al. |
| 7,691,658 | B2 | 4/2010 | Kaeding et al. |
| 7,709,284 | B2 | 5/2010 | Iza et al. |
| 7,727,332 | B2 | 6/2010 | Habel et al. |
| 7,733,571 | B1 | 6/2010 | Li |
| 7,749,326 | B2 | 7/2010 | Kim et al. |
| 7,806,078 | B2 | 10/2010 | Yoshida |
| 7,858,408 | B2 | 12/2010 | Mueller et al. |
| 7,862,761 | B2 | 1/2011 | Okushima et al. |
| 7,923,741 | B1 | 4/2011 | Zhai et al. |
| 7,939,354 | B2 | 5/2011 | Kyono et al. |
| 7,968,864 | B2 | 6/2011 | Akita et al. |
| 8,044,412 | B2 | 10/2011 | Murphy et al. |
| 8,124,996 | B2 | 2/2012 | Raring et al. |
| 8,126,024 | B1 | 2/2012 | Raring |
| 8,143,148 | B1 | 3/2012 | Raring et al. |
| 8,242,522 | B1 | 8/2012 | Raring |
| 8,247,887 | B1 | 8/2012 | Raring et al. |
| 8,254,425 | B1 | 8/2012 | Raring |
| 8,259,769 | B1 | 9/2012 | Raring et al. |
| 8,294,179 | B1 | 10/2012 | Raring |
| 8,314,429 | B1 | 11/2012 | Raring et al. |
| 8,351,478 | B2 | 1/2013 | Raring et al. |
| 8,355,418 | B2 | 1/2013 | Raring et al. |
| 2002/0027933 | A1* | 3/2002 | Tanabe et al. .................. 372/45 |
| 2002/0085603 | A1 | 7/2002 | Okumura |
| 2002/0171092 | A1 | 11/2002 | Goetz et al. |
| 2003/0000453 | A1 | 1/2003 | Unno et al. |
| 2003/0001238 | A1 | 1/2003 | Ban |
| 2003/0012243 | A1 | 1/2003 | Okumura |
| 2003/0020087 | A1 | 1/2003 | Goto et al. |
| 2003/0140846 | A1 | 7/2003 | Biwa et al. |
| 2003/0178617 | A1 | 9/2003 | Appenzeller et al. |
| 2003/0200931 | A1 | 10/2003 | Goodwin |
| 2003/0216011 | A1 | 11/2003 | Nakamura et al. |
| 2004/0025787 | A1 | 2/2004 | Selbrede et al. |
| 2004/0060518 | A1 | 4/2004 | Nakamura et al. |
| 2004/0099213 | A1 | 5/2004 | Adomaitis et al. |
| 2004/0146264 | A1 | 7/2004 | Auner et al. |
| 2004/0151222 | A1 | 8/2004 | Sekine |
| 2004/0233950 | A1 | 11/2004 | Furukawa et al. |
| 2004/0247275 | A1 | 12/2004 | Vakhshoori et al. |
| 2005/0040384 | A1 | 2/2005 | Tanaka et al. |
| 2005/0072986 | A1 | 4/2005 | Sasaoka |
| 2005/0168564 | A1 | 8/2005 | Kawaguchi et al. |
| 2005/0214992 | A1 | 9/2005 | Chakraborty et al. |
| 2005/0218413 | A1 | 10/2005 | Matsumoto et al. |
| 2005/0229855 | A1 | 10/2005 | Raaijmakers |
| 2005/0230701 | A1 | 10/2005 | Huang |
| 2005/0247260 | A1 | 11/2005 | Shin et al. |
| 2005/0285128 | A1 | 12/2005 | Scherer et al. |
| 2006/0033009 | A1 | 2/2006 | Kobayashi et al. |
| 2006/0060131 | A1 | 3/2006 | Atanackovic |
| 2006/0077795 | A1 | 4/2006 | Kitahara et al. |
| 2006/0078022 | A1 | 4/2006 | Kozaki et al. |
| 2006/0086319 | A1 | 4/2006 | Kasai et al. |
| 2006/0126688 | A1 | 6/2006 | Kneissl |
| 2006/0144334 | A1 | 7/2006 | Yim et al. |
| 2006/0175624 | A1 | 8/2006 | Sharma et al. |
| 2006/0193359 | A1 | 8/2006 | Kuramoto |
| 2006/0216416 | A1 | 9/2006 | Sumakeris et al. |
| 2006/0256482 | A1 | 11/2006 | Araki et al. |
| 2007/0081857 | A1 | 4/2007 | Yoon |
| 2007/0086916 | A1 | 4/2007 | LeBoeuf et al. |
| 2007/0093073 | A1 | 4/2007 | Farrell, Jr. et al. |
| 2007/0101932 | A1 | 5/2007 | Schowalter et al. |
| 2007/0110112 | A1 | 5/2007 | Sugiura |
| 2007/0120141 | A1 | 5/2007 | Moustakas et al. |
| 2007/0153866 | A1 | 7/2007 | Shchegrov et al. |
| 2007/0163490 | A1 | 7/2007 | Habel et al. |
| 2007/0184637 | A1 | 8/2007 | Haskell et al. |
| 2007/0217462 | A1 | 9/2007 | Yamasaki |
| 2007/0242716 | A1 | 10/2007 | Samal et al. |
| 2007/0259464 | A1 | 11/2007 | Bour et al. |
| 2007/0272933 | A1 | 11/2007 | Kim et al. |
| 2007/0280320 | A1 | 12/2007 | Feezell et al. |
| 2008/0092812 | A1 | 4/2008 | McDiarmid et al. |
| 2008/0095492 | A1 | 4/2008 | Son et al. |
| 2008/0121916 | A1 | 5/2008 | Teng et al. |
| 2008/0124817 | A1 | 5/2008 | Bour et al. |
| 2008/0149949 | A1 | 6/2008 | Nakamura et al. |
| 2008/0149959 | A1 | 6/2008 | Nakamura et al. |
| 2008/0164578 | A1 | 7/2008 | Tanikella et al. |
| 2008/0173735 | A1 | 7/2008 | Mitrovic et al. |
| 2008/0191223 | A1 | 8/2008 | Nakamura et al. |
| 2008/0217745 | A1 | 9/2008 | Miyanaga et al. |
| 2008/0232416 | A1 | 9/2008 | Okamoto et al. |
| 2008/0251020 | A1 | 10/2008 | Franken et al. |
| 2008/0283851 | A1 | 11/2008 | Akita |
| 2008/0291961 | A1 | 11/2008 | Kamikawa et al. |
| 2008/0308815 | A1 | 12/2008 | Kasai et al. |
| 2008/0315179 | A1 | 12/2008 | Kim et al. |
| 2009/0021723 | A1 | 1/2009 | De Lega |
| 2009/0058532 | A1 | 3/2009 | Kikkawa et al. |
| 2009/0066241 | A1 | 3/2009 | Yokoyama |
| 2009/0078944 | A1 | 3/2009 | Kubota et al. |
| 2009/0080857 | A1 | 3/2009 | St. John-Larkin |
| 2009/0081857 | A1 | 3/2009 | Hanser et al. |
| 2009/0141765 | A1 | 6/2009 | Kohda et al. |
| 2009/0153752 | A1 | 6/2009 | Silverstein |
| 2009/0159869 | A1 | 6/2009 | Ponce et al. |
| 2009/0229519 | A1 | 9/2009 | Saitoh |
| 2009/0250686 | A1 | 10/2009 | Sato et al. |
| 2009/0267100 | A1 | 10/2009 | Miyake et al. |
| 2009/0273005 | A1 | 11/2009 | Lin |
| 2009/0309110 | A1 | 12/2009 | Raring et al. |
| 2009/0309127 | A1 | 12/2009 | Raring et al. |
| 2009/0316116 | A1 | 12/2009 | Melville et al. |
| 2009/0321778 | A1 | 12/2009 | Chen et al. |
| 2010/0006546 | A1 | 1/2010 | Young et al. |
| 2010/0006873 | A1 | 1/2010 | Raring et al. |
| 2010/0044718 | A1 | 2/2010 | Hanser et al. |
| 2010/0096615 | A1 | 4/2010 | Okamoto et al. |
| 2010/0104495 | A1 | 4/2010 | Kawabata et al. |
| 2010/0140745 | A1 | 6/2010 | Khan et al. |
| 2010/0195687 | A1 | 8/2010 | Okamoto et al. |
| 2010/0220262 | A1 | 9/2010 | DeMille et al. |
| 2010/0276663 | A1 | 11/2010 | Enya et al. |
| 2010/0295054 | A1 | 11/2010 | Okamoto et al. |
| 2010/0302464 | A1 | 12/2010 | Raring et al. |
| 2010/0309943 | A1 | 12/2010 | Chakraborty et al. |
| 2010/0316075 | A1 | 12/2010 | Raring et al. |
| 2010/0327291 | A1 | 12/2010 | Preble et al. |
| 2011/0031508 | A1 | 2/2011 | Hamaguchi et al. |
| 2011/0057167 | A1 | 3/2011 | Ueno et al. |
| 2011/0064100 | A1 | 3/2011 | Raring et al. |
| 2011/0064101 | A1 | 3/2011 | Raring et al. |
| 2011/0064102 | A1 | 3/2011 | Raring et al. |
| 2011/0075694 | A1 | 3/2011 | Yoshizumi et al. |

| | | | |
|---|---|---|---|
| 2011/0103418 A1 | 5/2011 | Hardy et al. | |
| 2011/0129669 A1 | 6/2011 | Fujito et al. | |
| 2011/0164637 A1 | 7/2011 | Yoshizumi et al. | |
| 2011/0180781 A1 | 7/2011 | Raring et al. | |
| 2011/0182056 A1 | 7/2011 | Trottier et al. | |
| 2011/0188530 A1 | 8/2011 | Lell et al. | |
| 2011/0216795 A1 | 9/2011 | Hsu et al. | |
| 2011/0247556 A1 | 10/2011 | Raring et al. | |
| 2011/0281422 A1 | 11/2011 | Wang et al. | |
| 2011/0286484 A1 | 11/2011 | Raring et al. | |
| 2012/0104359 A1 | 5/2012 | Felker et al. | |
| 2012/0178198 A1 | 7/2012 | Raring et al. | |
| 2012/0187371 A1 | 7/2012 | Raring et al. | |
| 2012/0314398 A1 | 12/2012 | Raring et al. | |
| 2013/0016750 A1 | 1/2013 | Raring et al. | |
| 2013/0022064 A1 | 1/2013 | Raring et al. | |
| 2013/0044782 A1 | 2/2013 | Raring | |

FOREIGN PATENT DOCUMENTS

| | | |
|---|---|---|
| CN | 1702836 | 11/2005 |
| CN | 101079463 | 11/2007 |
| CN | 101099245 | 1/2008 |
| CN | 101171692 | 4/2008 |
| JP | 3-287770 | 12/1991 |
| JP | 2007173467 | 7/2007 |
| WO | 2008/041521 | 4/2008 |

OTHER PUBLICATIONS

Chinese Office Action From Chinese Patent Application No. 200980134723.8 dated Nov. 1, 2012, 22 pgs. (With Translation).
Founta et al., 'Anisotropic Morphology of Nonpolar a-Plane GaN Quantum Dots and Quantum Wells,' Journal of Applied Physics, vol. 102, vol. 7, 2007, pp. 074304-1-074304-6.
Franssila, 'Tools for CVD and Epitaxy', Introduction to Microfabrication, 2004, pp. 329-336.
Khan, 'Cleaved Cavity Optically Pumped InGaN-GaN Laser Grown on Spinel Substrates,' Applied Physics Letters, vol. 69, No. 16, 1996, pp. 2417-2420.
Lin et al., 'Influence of Separate Confinement Heterostructure Layer on Carrier Distribution in InGaAsP Laser Diodes With Nonidentical Multiple Quantum Wells,' Japanese Journal of Applied Physics, vol. 43, No. 10, 2004, pp. 7032-7035.
Okamoto et al., 'High-Efficiency Continuous-Wave Operation of Blue-Green Laser Diodes Based on Nonpolar mPlane Gallium Nitride,' The Japan Society of Applied Physics, Applied Physics, Express 1, 2008, pp. 072201-1-072201-3.
Park, 'Crystal Orientation Effects on Electronic Properties of Wurtzite InGaN/GaN Quantum Wells,', Journal of Applied Physics, vol. 91, No. 12, 2002, pp. 9903-9908.
Romanov et al., 'Strain-Induced Polarization in Wurtzite III-Nitride Semipolar Layers,' Journal of Applied Plysics, vol. 100, 2006, pp. 023522-1 through 023522-10.
Schoedl, 'Facet Degradation of GaN Heterostructure Laser Diodes,' Journal of Applied Physics, vol. 97, issue 12, 2006, pp. 123102-1-123102-8.
USPTO Office Action for U.S. Appl. No. 12/481,543 dated Jun. 27, 2011.
USPTO Office Action for U.S. Appl. No. 12/482,440 dated Feb. 23, 2011.
USPTO Office Action for U.S. Appl. No. 12/482,440 dated Aug. 12, 2011.
USPTO Office Action for U.S. Appl. No. 12/484,924 dated Apr. 14, 2011.
USPTO Office Action for U.S. Appl. No. 12/484,924 dated Oct. 31, 2011.
USPTO Office Action for U.S. Appl. No. 12/491,169 dated Oct. 22, 2010.
USPTO Office Action for U.S. Appl. No. 12/491,169 dated May 11, 2011.
USPTO Office Action for U.S. Appl. No. 12/497,289 dated Feb. 2, 2012.
USPTO Notice of Allowance for U.S. Appl. No. 12/497,289 dated May 22, 2012.
USPTO Office Action for U.S. Appl. No. 12/502,058 dated Dec. 8, 2010.
USPTO Office Action for U.S. Appl. No. 12/502,058 dated Aug. 19, 2011.
USPTO Notice of Allowance for U.S. Appl. No. 12/502,058 dated Apr. 16, 2012.
USPTO Notice of Allowance for U.S. Appl. No. 12/502,058 dated Jul. 19, 2012.
USPTO Office Action for U.S. Appl. No. 12/534,829 dated Apr. 19, 2011.
USPTO Notice of Allowance for U.S. Appl. No. 12/534,829 dated Oct. 28, 2011.
USPTO Notice of Allowance for U.S. Appl. No. 12/534,829 dated Dec. 5, 2011.
USPTO Notice of Allowance for U.S. Appl. No. 12/534,829 dated Dec. 21, 2011.
USPTO Office Action for U.S. Appl. No. 12/573,820 dated Mar. 2, 2011.
USPTO Office Action for U.S. Appl. No. 12/573,820 dated Oct. 11, 2011.
USPTO Office Action for U.S. Appl. No. 12/749,466 dated Jun. 29, 2011.
USPTO Office Action for U.S. Appl. No. 12/749,466 dated Feb. 3, 2012.
USPTO Office Action for U.S. Appl. No. 12/749,466 dated Jul. 3, 2012.
USPTO Office Action for U.S. Appl. No. 12/759,273 dated Nov. 21, 2011.
USPTO Office Action for U.S. Appl. No. 12/759,273 dated Jun. 26, 2012.
USPTO Office Action for U.S. Appl. No. 12/762,269 dated Oct. 12, 2011.
USPTO Notice of Allowance for U.S. Appl. No. 12/762,269 dated Apr. 23, 2012.
USPTO Office Action for U.S. Appl. No. 12/762,271 dated Dec. 23, 2011.
USPTO Office Action for U.S. Appl. No. 12/762,271 dated Jun. 6, 2012.
USPTO Notice of Allowance for U.S. Appl. No. 12/762,271 dated Aug. 8, 2012.
USPTO Notice of Allowance for U.S. Appl. No. 12/762,278 dated Nov. 7, 2011.
USPTO Office Action for U.S. Appl. No. 12/778,718 dated Nov. 25, 2011.
USPTO Notice of Allowance for U.S. Appl. No. 12/778,718 dated Apr. 3, 2012.
USPTO Notice of Allowance for U.S. Appl. No. 12/778,718 dated Jun. 13, 2012.
USPTO Office Action for U.S. Appl. No. 12/789,303 dated Sep. 24, 2012.
USPTO Office Action for U.S. Appl. No. 12/859,153 dated Sep. 25, 2012.
USPTO Office Action for U.S. Appl. No. 12/868,441 dated Apr. 30, 2012.
USPTO Office Action for U.S. Appl. No. 12/880,803 dated Feb. 22, 2012.
USPTO Notice of Allowance for U.S. Appl. No. 12/880,803 dated Jul. 18, 2012.
USPTO Office Action for U.S. Appl. No. 12/883,093 dated Mar. 13, 2012.
USPTO Office Action for U.S. Appl. No. 12/883,093 dated Aug. 3, 2012.
USPTO Notice of Allowance for U.S. Appl. No. 12/883,093 dated Nov. 21, 2012.
USPTO Office Action for U.S. Appl. No. 12/883,652 dated Apr. 17, 2012.
USPTO Office Action for U.S. Appl. No. 12/884,993 dated Mar. 16, 2012.
USPTO Office Action for U.S. Appl. No. 12/884,993 dated Aug. 2, 2012.
USPTO Notice of Allowance for U.S. Appl. No. 12/884,993 dated Nov. 26, 2012.

USPTO Office Action for U.S. Appl. No. 12/995,946 dated Mar. 28, 2012.
USPTO Office Action for U.S. Appl. No. 13/014,622 dated Nov. 28, 2011.
USPTO Office Action for U.S. Appl. No. 13/014,622 dated Apr. 30, 2012.
USPTO Office Action for U.S. Appl. No. 13/046,565 dated Nov. 7, 2011.
USPTO Office Action for U.S. Appl. No. 13/046,565 dated Feb. 2, 2012.
USPTO Office Action for U.S. Appl. No. 13/046,565 dated Apr. 13, 2012.
USPTO Office Action for U.S. Appl. No. 13/046,565 dated Jul. 19, 2012.
USPTO Office Action for U.S. Appl. No. 13/354,639 dated Nov. 7, 2012.
USPTO Notice of Allowance for U.S. Appl. No. 13/354,639 dated Dec. 14, 2012.
International Preliminary Report & Written Opinion of PCT Application No. PCT/US2011/037792, dated Sep. 8, 2011, 13 pages total.
USPTO Office Action for U.S. Appl. No. 12/995,946 dated Jan. 29, 2013.
USPTO Office Action for U.S. Appl. No. 12/859,153 dated Feb. 26, 2013.
USPTO Office Action for U.S. Appl. No. 12/942,817 dated Feb. 20, 2013.
USPTO Notice of Allowance for U.S. Appl. No. 13/108,645 dated Jan. 28, 2013.
USPTO Office Action for U.S. Appl. No. 13/291,922 dated Feb. 20, 2013.
USPTO Office Action for U.S. Appl. No. 13/425,354 dated Feb. 14, 2013.
USPTO Office Action for U.S. Appl. No. 13/548,312 dated Mar. 12, 2013.

* cited by examiner

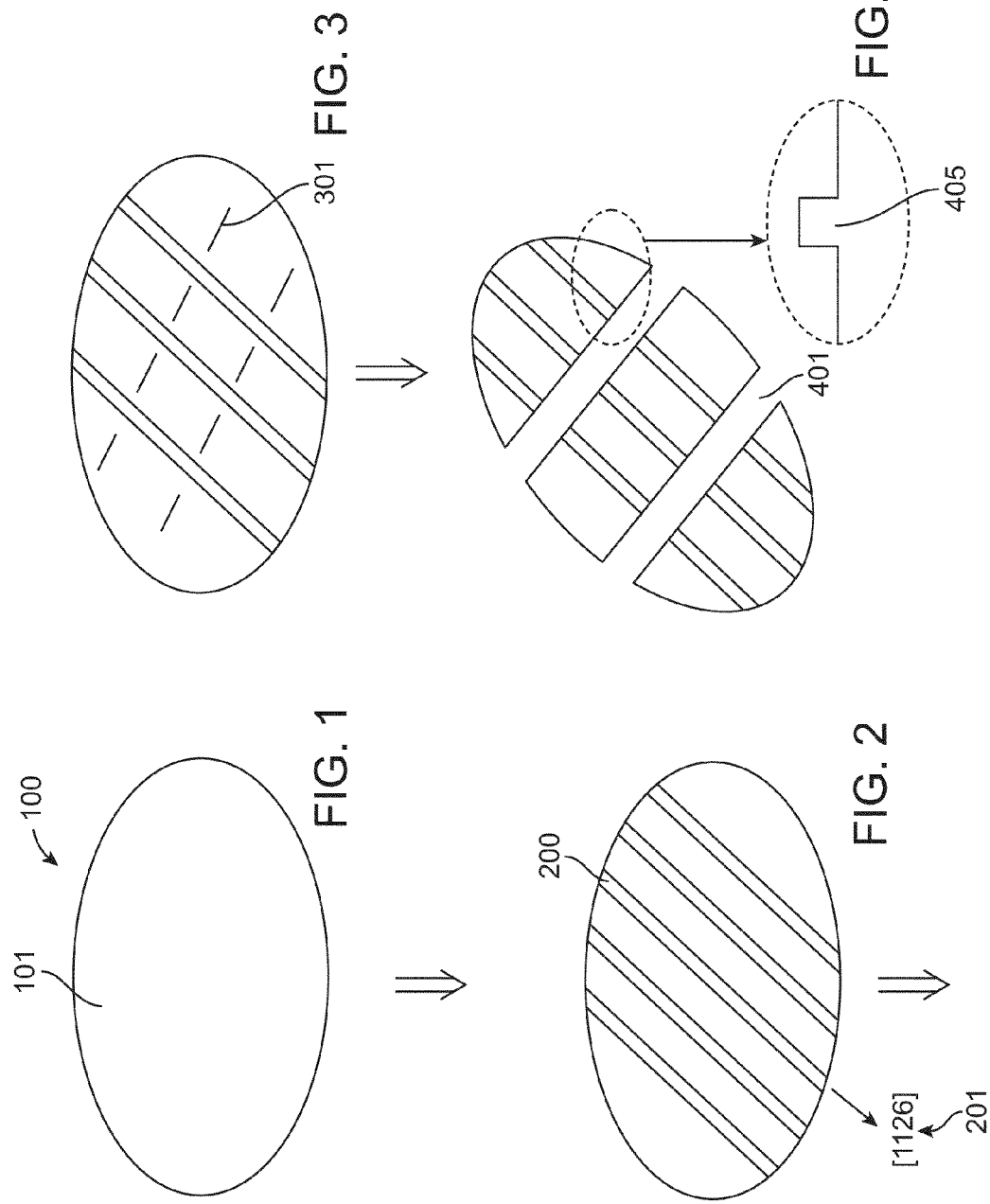

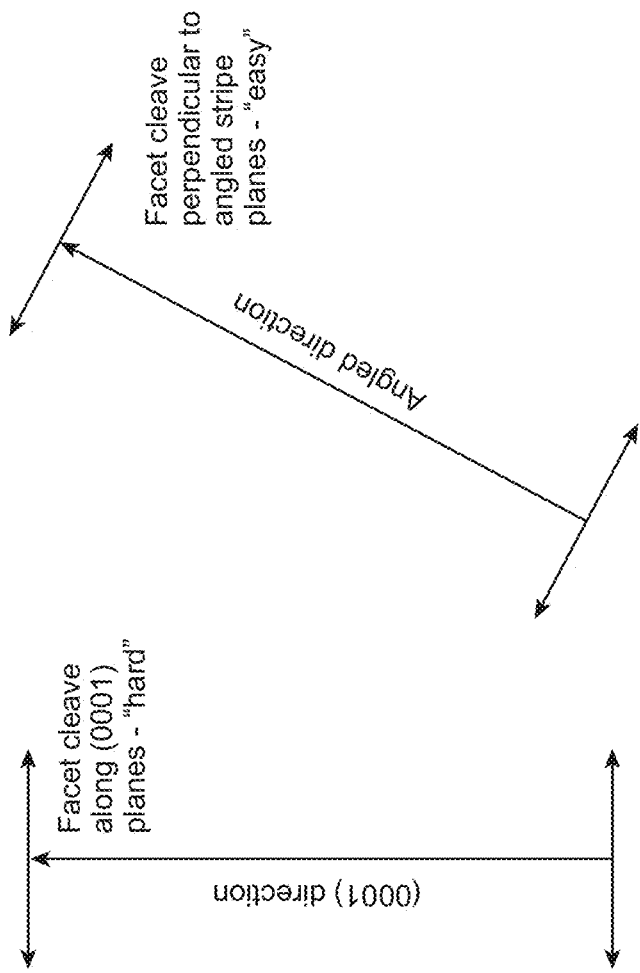
FIG. 5
FIG. 6
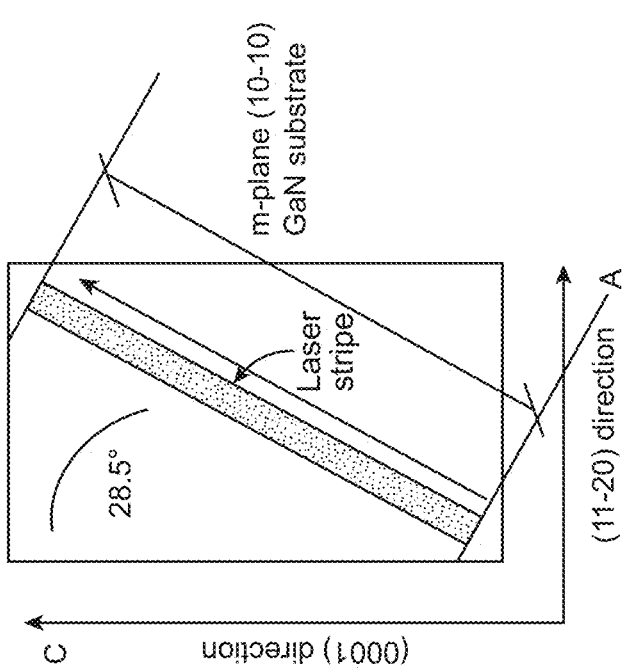
FIG. 7

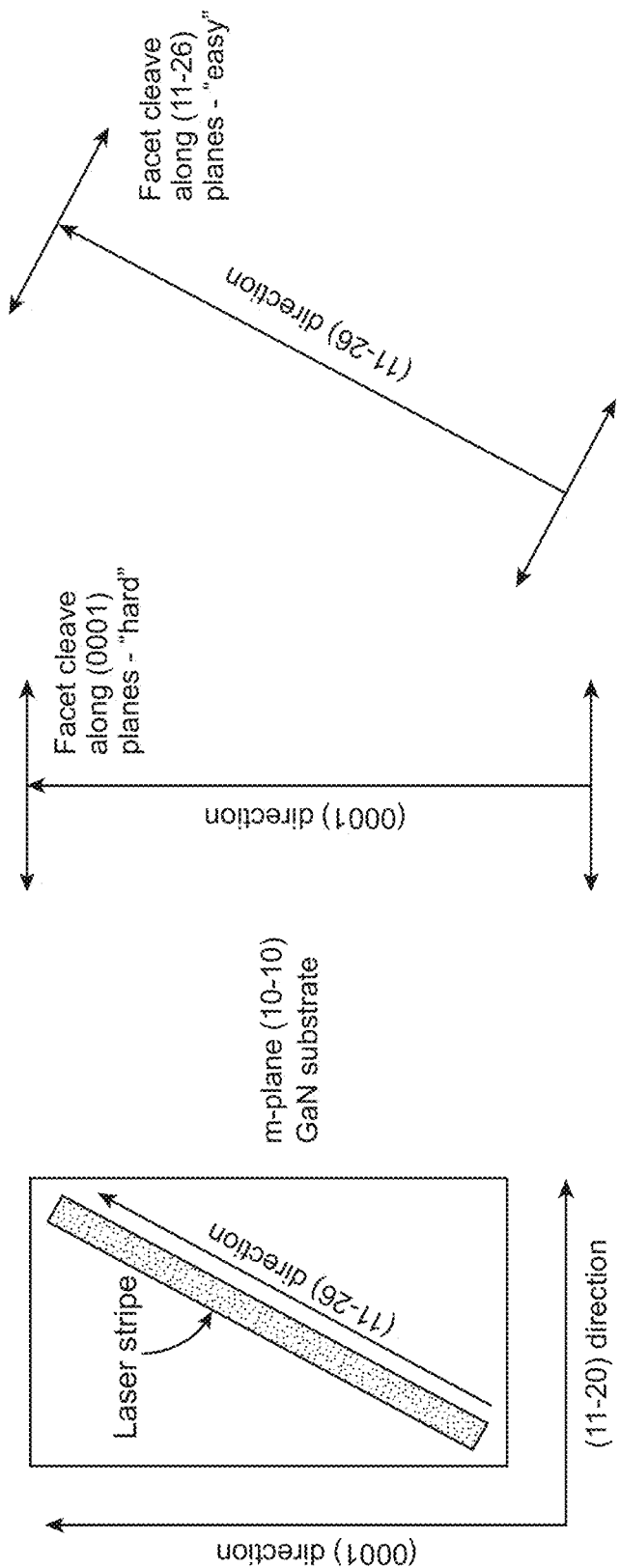

SOLID STATE LASER DEVICE USING A SELECTED CRYSTAL ORIENTATION IN NON-POLAR OR SEMI-POLAR GAN CONTAINING MATERIALS AND METHODS

CROSS-REFERENCES TO RELATED APPLICATIONS

This application is a continuation of U.S. application Ser. No. 12/534,838 filed on Aug. 3, 3009 now U.S. Pat. No. 8,284,810, now allowed, which claims priority to U.S. provisional Application No. 61/086,142 filed on Aug. 4, 2008, each of which is incorporated by reference herein.

BACKGROUND OF THE INVENTION

The present invention relates generally to manufacture of optical devices. More particularly, the present invention provides a laser device and method using a preferred cleave orientation, which facilitates parallel facets and reduced surface roughness. Although the invention has been described in terms of cleaving, it would be recognized that other ways of forming the facet can be used. As an example, the facets can be etched, cut, separated, split, among others. Additionally, the invention can also be applied to other forms of devices such as light emitting diodes, integrated circuits, MEMS, medical devices, combination of these, among others.

Human beings have been attempting to develop new types of solid materials from the early days. From the stone-age to the electronic age, human beings have progressed through stone, brass and copper, steel, plastics, and now semiconductors. An example of a commonly used semiconductor is silicon. Silicon is used extensively in the manufacture of integrated circuits, which form the basis of electronic devices and systems, including cellular phones, computers, video games, and solar panels. Other types of semiconductor materials have also been proposed.

One such semiconductor material that has gained popularity is gallium nitride, commonly called "GaN." GaN serves as the basis of blue colored light emitting diodes, which were pioneered by a famous inventor named Shuji Nakamura. Most recently, considerable progress has been made in recent years in the fabrication of gallium nitride based laser diodes, which are useful for optical data storage, such as Blu-ray™ digital video discs, which is a trademark of the Blu-ray Disc Association. The Blu-ray disc format typically contains 5-10 times as much stored information as the predecessor DVD optical data storage format, which was based on the capabilities of red laser diodes. In addition to their usefulness for optical data storage, GaN-based laser diodes could also be extremely useful for projection displays, among other applications.

Conventional GaN-based laser diodes were fabricated on c-plane sapphire substrates, utilizing epitaxial lateral overgrowth techniques to reduce the high concentration of threading dislocations which form at the sapphire/GaN interface. The c-plane substrate orientation was utilized mainly because smooth epitaxial layers could be obtained. Later, as high quality bulk GaN substrates began to become available, laser diode manufacturers began to switch from the use of sapphire as a substrate to bulk GaN. An example of a homoepitaxial laser diode is disclosed by U.S. Pat. No. 6,936,488, which is hereby incorporated by reference in its entirety. However, for the most part, most laser diode manufacturers continued to use the c-plane orientation.

Existing methods suffer from a number of limitations. First, the efficiency of light emission in the nitrides tends to fall off markedly as the emission wavelength is increased from violet to blue, green, and beyond. Practical c-plane GaN-based laser diodes have not yet been demonstrated in green or longer wavelengths. Bright green laser diodes are needed in order to enable projection applications, in combination with blue and red laser diodes. A second limitation is that the threshold current of the devices is sometimes undesirably high, which decreases the efficiency of the devices. A third limitation is that the yield of intact devices tends to be small, mainly due to breakage during the fabrication process.

From the above, it is seen that improved techniques for developing gallium containing substrates are highly desired.

BRIEF SUMMARY OF THE INVENTION

According to the present invention, techniques for manufacture of optical devices are provided. More particularly, the present invention provides a laser device and method using a preferred cleave orientation, which facilitates parallel facets and reduced surface roughness. Although the invention has been described in terms of cleaving, it would be recognized that other ways of forming the facet can be used. As an example, the facets can be etched, cut, separated, split, among others. Additionally, the invention can also be applied to other forms of devices such as light emitting diodes, integrated circuits, MEMS, medical devices, combination of these, among others.

In a specific embodiment, the present invention provides a GaN-based laser characterized by orientation of $\{1\ 1-2\pm6\}$ facets. The orientation, surprisingly and unexpectedly, turns out to be a preferential cleavage plane of GaN. Conventional non-polar or semi-polar GaN-based laser diodes utilized near-c-plane or a-plane facets, in some cases formed by etching rather than cleaving. We are not aware of any other wurtzite-structure semiconductor laser diodes that utilize cleaved facets with a $\{1\ 1-2\pm6\}$ orientation except for the discovery described herein.

In a specific embodiment, the present invention provides a laser diode device. The laser diode device has a wurtzite-structure crystalline substrate, an active epitaxial layer, and end facets configured for edge emission. The end facets are within $\pm1$ degree of a $\{1\ 1-2\pm6\}$ crystallographic orientation and are prepared by cleaving.

In an alternative specific embodiment, the present invention provides a method of fabrication of a non-polar or semi-polar laser diode terminated by $\{1\ 1-2\pm6\}$ facets.

In an alternative specific embodiment, the present invention provides a laser diode device. The device has a wurtzite-structure crystalline substrate containing a gallium species and an active epitaxial layer within the wurtzite-structure. The device also has at least one end facet for edge emission coupled to the active epitaxial layer, the end facet being a cleaved surface within $\pm5$ degrees of a $\{1\ 1-2\pm6\}$ crystallographic orientation.

In yet an alternative specific embodiment, the present invention provides a method of fabrication a non-polar or semi-polar laser diode device. The method includes providing a wurtzite-structure crystalline substrate containing a gallium species and processing a portion of the wurtzite-structure crystalline substrate to form at least one end facet characterized by a cleaved surface within $\pm5$ degrees of a $\{1\ 1-2\pm6\}$ crystallographic orientation.

Still further, the present invention provides an alternative laser device. The laser device has a gallium nitride or aluminum nitride containing crystalline material and a laser cavity formed within a portion of the gallium nitride or aluminum nitride containing crystalline material. In a specific embodiment, the laser cavity is characterized by a length extending from a first region to a second region. The device also has a first facet provided on the first region and a second facet provided on the second region. In a preferred embodiment, the device has an orientation of approximately 28.5 degrees from a [0001] direction of the gallium nitride or aluminum nitride containing crystalline material characterizing the direction of the length of the laser cavity.

Still further, the present invention provides an optical device comprising a wurtzite-structure crystalline substrate containing a gallium and a nitrogen species. The device also has an active epitaxial layer within the wurtzite-structure and at least one end facet for edge emission coupled to the active epitaxial layer. In a specific embodiment, the end facet is characterized by a cleaved surface within ±5 degree of a predetermined crystallographic orientation.

Moreover, the present invention provides a method of fabrication of a non-polar or semi-polar laser diode device. The method includes providing a wurtzite-structure crystalline substrate containing a gallium species and forming at least one cleaved surface within ±10 degree of a {1 1-2±6} crystallographic orientation of the wurtzite-structure crystalline substrate, or other preferred crystallographic orientation.

One or more benefits may be achieved using one or more of the specific embodiments. As an example, the present device and method provides for higher yields over conventional techniques in fabricating facets for laser devices. In other embodiments, the present method and resulting structure are easier to form by way of a preferential cleaving plane in a gallium nitride containing crystalline material. In other embodiments, the present laser device has a pair of facets that are substantially parallel to each other that will provide higher efficiencies, lower optical losses, and reduced threshold currents.

The present invention achieves these benefits and others in the context of known process technology. However, a further understanding of the nature and advantages of the present invention may be realized by reference to the latter portions of the specification and attached drawings.

BRIEF DESCRIPTION OF THE DRAWINGS

FIGS. 1 to 4 illustrate a method of fabricating a laser device according to an embodiment of the present invention FIGS. 5 to 7 are simplified diagrams illustrating a top-view diagram of a laser device according to an embodiment of the present invention;

FIGS. 8 to 10 are simplified diagrams illustrating a top-view diagram of an alternative laser device according to an alternative embodiment of the present invention.

DETAILED DESCRIPTION OF THE INVENTION

Figure 4:
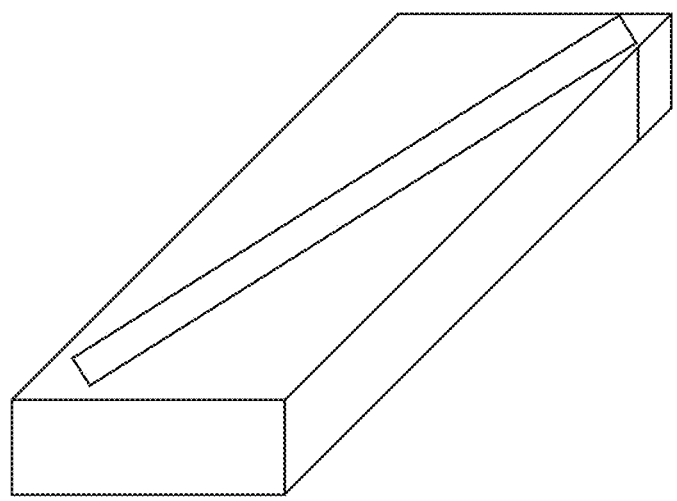

According to the present invention, techniques for manufacture of optical devices are provided. More particularly, the present invention provides a laser device and method using a preferred cleave orientation, which facilitates parallel facets and reduced surface roughness. Although the invention has been described in terms of cleaving, it would be recognized that other ways of forming the facet can be used. As an example, the facets can be etched, cut, separated, split, among others. Additionally, the invention can also be applied to other forms of devices such as light emitting diodes, integrated circuits, MEMS, medical devices, combination of these, among others.

We believe that breakthroughs in the field of GaN-based optoelectronics have demonstrated the great potential of optoelectronic devices, such as light emitting diodes (LEDs) and laser diodes, fabricated on bulk nonpolar and semipolar GaN substrates. The lack of strong polarization induced electric fields that plague conventional devices on c-plane GaN leads to a greatly enhanced radiative recombination efficiency in the light emitting InGaN layers. Furthermore, the nature of the electronic band structure and the anisotropic in-plane strain leads to highly polarized light emission, which will offer several advantages in applications such as projection displays.

Non-polar GaN substrates, in particularly, {1-100} m-plane oriented substrates, have been utilized to fabricate violet and blue laser diodes with excellent characteristics [1-7]. In all cases, the end facets of the laser diode comprised either near-c-plane or a-plane, and in a number of cases the facet was formed by etching rather than by cleaving. Typically, the threshold current in laser diodes in which the laser stripe was fabricated in the c-direction, i.e., with near-c-plane end facets, was less than the case where the laser stripe was fabricated in the a-direction. A more limited number of laser diode structures have been reported on semi-polar GaN substrates, including a violet laser diode on {1 0-1-1} GaN [8] and photopumped stimulated violet-to-blue-green emission on {1 1-2 2} GaN [9].

A method for fabricating a laser device is outlined below.
1. Provide an n-type (or NID) GaN substrate;
2. Deposit a n-type GaN layer overlying the substrate;
3. Deposit an active region overlying the n-type GaN layer;
4. Deposit p-type GaN layer overlying the active region;
5. Form stripes using photolithographic and etching process;
6. Form passivation layer overlying the stripes;
7. Form contact regions through the passivation layer;
8. Form metallization layer overlying the contact regions;
9. Thin GaN substrate to desired thickness;
10. Scribe facet regions for each of the stripes along preferred crystal orientation;
11. Separate each of the stripes; and
12. Perform other steps, as desired.

The above sequence of steps provides a method according to an embodiment of the present invention. In a specific embodiment, the present invention provides a method and device for preferential cleaving to form cleaved facet regions for laser devices. Other alternatives can also be provided where steps are added, one or more steps are removed, or one or more steps are provided in a different sequence without departing from the scope of the claims herein.

FIGS. 1 to 4 illustrate a method of fabricating a laser device according to an embodiment of the present invention. As shown, a non-polar or semi-polar laser diode may be fabricated on a bulk gallium nitride substrate 100. As shown, the bulk gallium nitride has surface region 101. Gallium nitride is a hexagonal, wurtzite-structure crystal (space group $P6_3mc$; point group 6 mm) with distinct growth sectors. The gallium nitride substrate may be sliced from a boule that was grown by hydride vapor phase epitaxy or ammonothermally, according to methods known in the art. In a specific embodiment, the gallium nitride substrate is fabricated by a combination of hydride vapor phase epitaxy and ammonothermal growth, as disclosed in U.S. Patent Application Publication No. 2010/0003492, which is incorporated by reference herein. The boule may be grown in the c-direction, the m-direction, the a-direction, or in a semi-polar direction on a single-crystal seed crystal. The gallium nitride substrate may be cut, lapped, polished, and chemical-mechanically polished. The gallium nitride substrate orientation may be within ±5 degrees, ±2 degrees, ±1 degree, or ±0.5 degrees of the non-polar {1-1 0 0} m plane, of the semi-polar {8 0-8±7} plane, or of the semi-polar {4 4-8±7} plane. The latter two semi-polar planes are tilted, by approximately 3 degrees, with respect to the semi-polar {1 0-1±1} and {1 1-2±2} planes, respectively. The gallium nitride substrate may have a dislocation density in the plane of the large-area surface that is less than $10^6$ cm$^{-2}$, less than $10^5$ cm$^{-2}$, less than $10^4$ cm$^{-2}$, or less than $10^3$ cm$^{-2}$. The gallium nitride substrate may have a dislocation density in the c plane that is less than $10^6$ cm$^{-2}$, less than $10^5$ cm$^{-2}$, less than $10^4$ cm$^{-2}$, or less than $10^3$ cm$^{-2}$.

A homoepitaxial non-polar or semi-polar laser diode is fabricated on the gallium nitride substrate according to methods that are known in the art, for example, following the methods disclosed in U.S. Pat. No. 7,053,413, which is hereby incorporated by reference in its entirety. At least one $Al_xIn_yGa_{1-x-y}N$ layer, where $0 \leq x \leq 1$, $0 \leq y \leq 1$, and $0 \leq x+y \leq 1$, is deposited on the substrate, for example, following the methods disclosed by U.S. Pat. Nos. 7,338,828 and 7,220,324, which are hereby incorporated by reference in their entirety. The at least one $Al_xIn_yGa_{1-x-y}N$ layer may be deposited by metal-organic chemical vapor deposition, by molecular beam epitaxy, by hydride vapor phase epitaxy, or by a combination thereof. In a specific embodiment, the device comprises an active layer that preferentially emits light when an electrical current is passed through it. In one specific embodiment, the active layer comprises a single quantum well, with a thickness between about 1 nm and about 30 nm. In a specific embodiment, the active layer comprises a single quantum well with a thickness between about 1 nm and about 5 nm. In other embodiments, the active layer comprises a single quantum well with a thickness between about 5 nm and about 10 nm, between about 10 nm and about 15 nm, between about 15 nm and about 20 nm, between about 20 nm and about 25 nm, between about 25 nm and about 30 nm, between about 30 nm and about 35 nm, or between about 35 nm and about 40 nm. In another set of embodiments, the active layer comprises a multiple quantum well. In one specific embodiment, the active layer comprises an $In_yGa_{1-y}N$ layer, where $0 \leq y \leq 1$.

In some embodiments, the device includes an $Al_xGa_{1-x}N$ cladding layer, where $0 \leq x \leq 1$. In other embodiments, the device structure may include $Al_xGa_{1-x}N$ electron-blocking layers but is free of $Al_xGa_{1-x}N$ cladding layers. In some embodiments the light guiding layers comprise GaN. In other embodiments, to enhance the contrast in refractive index between layers, the light guiding layers may comprise $In_yGa_{1-y}N$ layer, where $0 \leq y \leq 1$.

After completion of the deposition of epitaxial nitride layers, the device is masked and lithographically etched to form a stripe or plurality of stripes 200. In a preferred embodiment, the stripe side walls are approximately perpendicular to the (1 1-2±6) plane 201. In a specific embodiment, the masking occurs using a photoresist mask, such as those manufactured by Clairiant Corporation or the Shipley Company. In a specific embodiment, etching occurs using a reactive ion or plasma etch using a chlorine species to form each of the plurality of stripes. In a specific embodiment, each of the stripes can have a width of about 0.25 micron to about 10 microns. In another embodiment, each of the stripes can have a width of about 1 micron to about 2 microns, but there can be others. Each of the stripes can also have a length ranging from about 200 microns to about 1 millimeter. As shown, each of the stripes extends from a vicinity of a first edge of the substrate to a second edge the substrate.

In a specific embodiment, the present method includes a metallization process to form interconnects for the laser diodes. The metallization can be formed using a masking and etching process. The metallization can be any suitable material such as gold, palladium, platinum, nickel, titanium, aluminum, and others. In a specific embodiment, the metalized device is covered using a dielectric layer or layers such as silicon dioxide, silicon nitride, or any combination of these materials.

Following metallization, the laser diodes are formed by cleaving along the {1 1-2 6} plane, as shown. That is, the method forms one or more scribe lines 301, which are formed in regions that correspond to facets of the laser devices. In a specific embodiment, each of the laser devices includes a pair of facets, which will be substantially parallel to each other. Scribing can occur using a variety of techniques such as mechanical scribing, laser scribing, chemical scribing, and others.

In a preferred embodiment, the method uses a laser scribing process. In a specific embodiment, the present invention scribes a portion of a gallium nitride substrate using a beam of light from a laser source. The laser source can have a suitable power, such as a range of about 200 milliwatts to about 1.5 Watts, but can be others. In a specific embodiment, the beam is characterized by a spot size ranging from about 1 to 20 microns. As merely an example, the laser source is solid state laser using Nd:YVO$_4$, among others.

In a specific embodiment, the method further comprises mechanically cleaving the scribed region to free 401 the facet characterized by the cleaved surface, as illustrated in FIG. 4. In a specific embodiment, the method introduces energy into the scribed region to free the facet characterized by the cleaved surface. As shown by reference numeral 405, a cleaved facet characterized by a root-mean-square surface roughness less than about 1 nm over a 25 micron square area, but can be others.

FIGS. 5 to 7 are simplified diagrams illustrating a top-view diagram of a laser device 500 according to an embodiment of the present invention. As shown is an edge-emitting laser device wherein the laser cavity is oriented approximately 28.5 degrees from the [0001] direction of the GaN crystal according to a specific embodiment. As noted, we discovered that a conventional edge-emitting laser device has challenging engineering problems. That is, it is often difficult to form smooth, parallel cleaved facets. For laser devices on m-plane GaN, the preferred stripe orientation 503 is along the c-direction. Unfortunately, cleaving along c-plane GaN is non-trivial and has limitations. In a preferred embodiment, the plane in GaN perpendicular to the angled strip direction 505 may be a preferred cleave plane, which is easier to cleave than along the c-plane, as shown by our preliminary experiments. Therefore, a laser cavity oriented along this angled direction on m-plane GaN, which is at an angle of 28.5°+/−5° to the [0001] c-direction in GaN, may be preferred to a cavity oriented over the [0001] direction, and result in an improved process yield during the cleaving step.

FIGS. 8 to 10 are simplified diagrams illustrating a top-view diagram of an alternative laser device 800 according to an alternative embodiment of the present invention. As shown, is an edge-emitting laser device according to an alternative embodiment. The laser cavity is oriented approximately perpendicularly to the {11-26} plane of the GaN crystal, as shown by a length extending perpendicular to the {11-26} plane. As noted, we discovered that the {11-26} plane in GaN is a preferred cleave plane, as shown by preliminary experiments. Therefore, a laser cavity oriented perpendicular to the {11-26} plane on m-plane GaN, which is at an angle of roughly 28.5° to the [0001] c-direction in GaN, may be preferred to a cavity oriented along the [0001] direction, and may result in an improved process yield during the cleaving step. Similarly, a laser cavity oriented perpendicular to the {11-26} plane on semi-polar GaN, with a large-area surface orientation of {8 0–8±7}, {4 4–8±7}, {1 0–1±1}, or {1 1–2±2}, which is at an angle of roughly 28.5° to the [0001] c-direction in GaN, may be preferred to a cavity oriented along the projection of the (0001) direction on the semi-polar surface, and may result in an improved process yield during the cleaving step. Of course, there can be other variations, modifications, and alternatives.

Although the above has been described in terms of specific embodiments, there can be other variations, modifications, and alternatives. In an alternative specific embodiment, the orientation can also vary slightly or substantially. In a specific embodiment, the wurtzite-structure crystalline substrate is within ±5 degrees of the non-polar {1-100} m plane. Alternatively, the wurtzite-structure crystalline substrate is within ±5 degrees of the semi-polar {8 0–8±7} plane. Alternatively, the orientation of the wurtzite-structure crystalline substrate is within ±5 degrees of the semi-polar {4 4–8±7} plane. Alternatively, the wurtzite-structure crystalline substrate comprises gallium and nitrogen. In other embodiments, the active epitaxial layer comprises a single quantum well with a thickness between about 1 and about 30 nanometers. In other embodiments, the active epitaxial layer comprises a single quantum well with a thickness between about 5 and about 15 nanometers and other embodiments include a multiple quantum well. In a specific embodiment, each quantum well has a layer thickness between about 1 and about 30 nanometers. In other embodiments, the active epitaxial layer comprises a multiple quantum well. Each quantum well has a layer thickness between about 5 and about 15 nanometers according to a specific embodiment. Alternatively, the device structure is free of AlGaN cladding layers. In other embodiments, the device structure comprises guiding layers comprising InGaN. Of course, there can be other variations, modifications, and alternatives.

The above sequence of steps provides a method according to an embodiment of the present invention. In a specific embodiment, the present invention provides a method and device for preferential cleaving to form cleaved facet regions for laser devices. Other alternatives can also be provided where steps are added, one or more steps are removed, or one or more steps are provided in a different sequence without departing from the scope of the claims herein.

EXAMPLES

Figure 11:
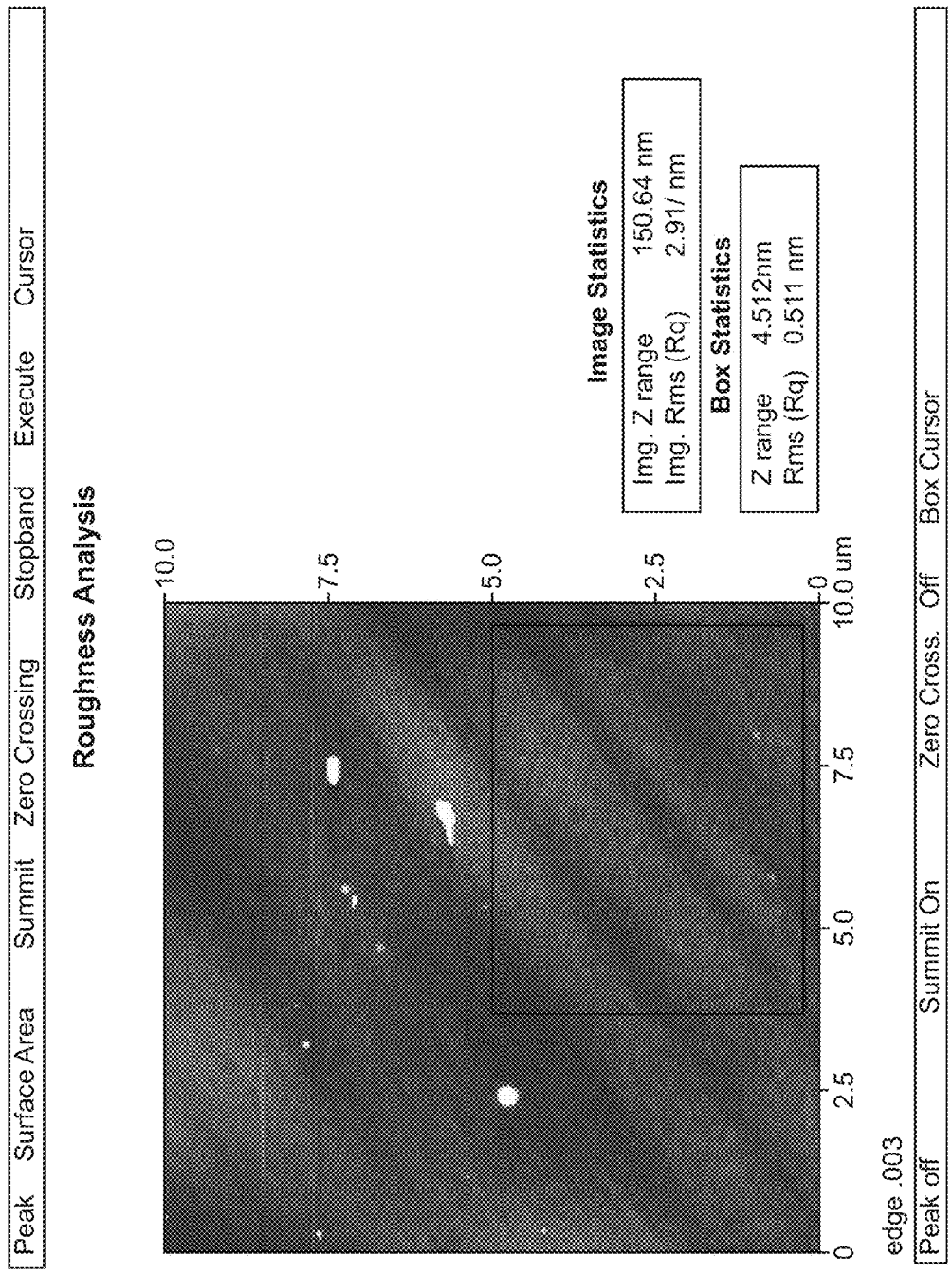
FIGS. 11 through 12 are top-view photographs of AFM images of experiment results according to embodiments of the present invention.
Figure 12:
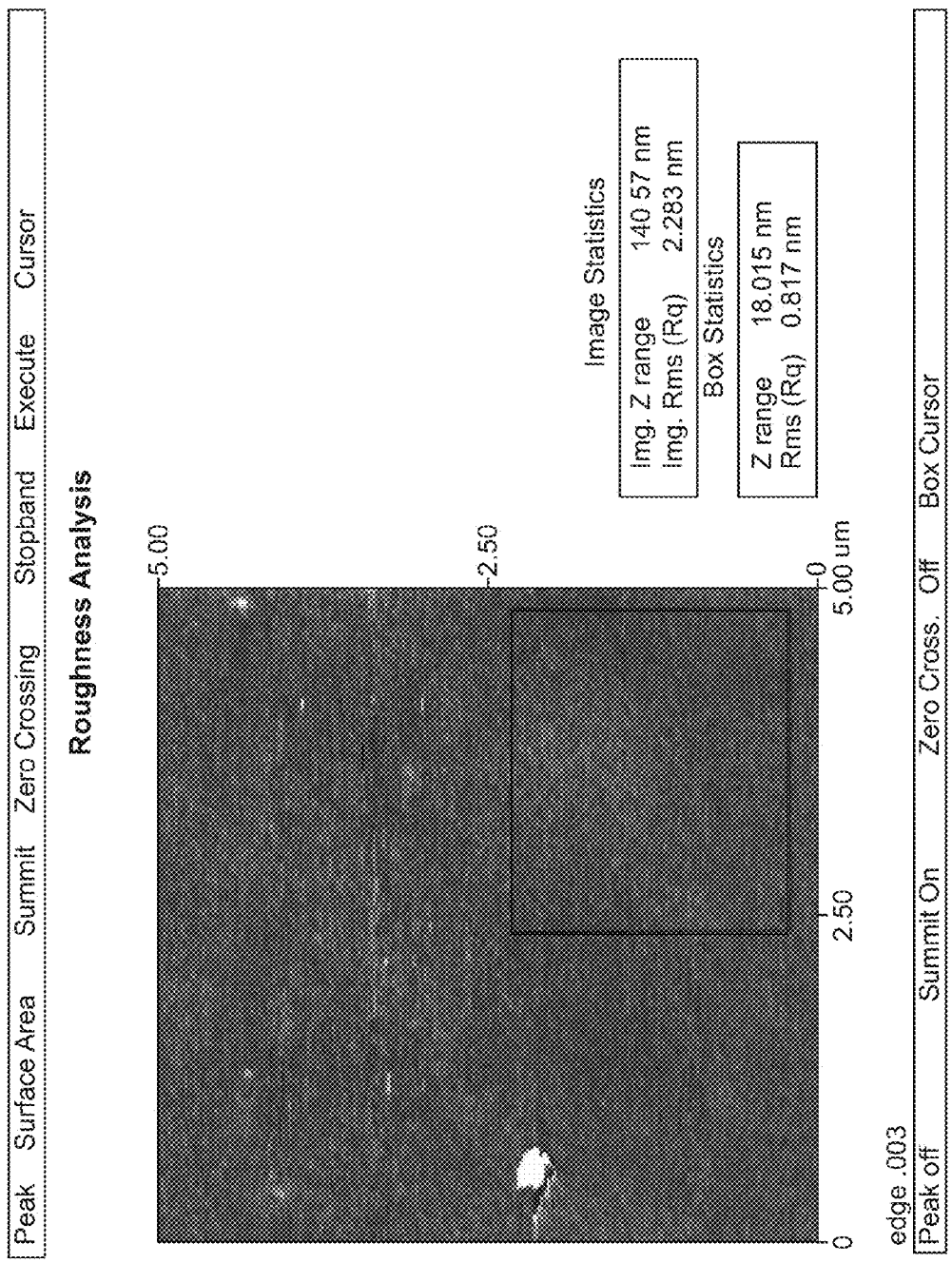

To prove the principle and operation of the present invention, we performed experiments using GaN substrate materials. In our experiment, we used m-plane GaN crystalline substrates manufactured by Mitsubishi Chemical Corporation, although other commercially available substrates are believed to also work. Details of the present experiments are provided by reference to FIGS. 11 through 12, which are top-view photographs of AFM images of experiment results according to embodiments of the present invention. These photographs are not intended to be limiting. As shown, the photographs illustrate a substantially smooth facet surface, which cleaved preferentially.

We discovered a certain plane or planes of a GaN crystalline material that cleaves preferentially to achieve substantially planar faces and desired surface roughness characteristics. In an attempt to prepare a c-plane-oriented cleavage surface on an m-plane, bulk GaN crystal, a series of interrupted laser scribe marks were placed on one m-plane surface parallel to the c plane of the crystal. The substrate crystal was then cleaved. Surprisingly, a number of very straight cleavage lines were formed at an oblique angle to the c plane. The cleavage plane was accurately perpendicular to the m-plane. The angle between the cleavage plane and the c-plane was measured to be 28.5 degrees, precisely the angle between (0001) and (1 1-2 6). The surface roughness of the cleaved surface was measured by atomic force microscopy over an area of about 25 square microns to be approximately 0.5 nm RMS, and possibly even less.

The observation that the {1 1-2 6} family of planes is a preferential cleavage plane in GaN is quite surprising. The easiest cleavage family of planes, {1-100}, or m plane, has an atomic structure with closely packed atoms, that is, a high surface atomic number density, and low Miller indices. The cleavage planes in other semiconductor materials, e.g., silicon (111) or gallium arsenide (110), similarly have a high surface atomic number density and low Miller indices. By contrast, the (1 1-2 6) surface, or at least the idealized bulk termination of this surface, has a significantly lower atomic number density and high Miller indices.

The use of the (1 1-2 6) planes for the end facets of the laser diodes has at least two advantages: (i) easy cleavage, increasing device yields; and (ii) orientation of the stripe in a direction that is close to (within about 30 degrees) of the c-direction, which takes advantage of the increased optical gain and thereby reduced threshold current in this direction. As shown, our experiments proved the operation of the present method and devices.

As used herein, certain terms should be interpreted by ordinary meaning known by one of ordinary skill in the art. As an example, the term "wurtzite structure" can be a crystal structure member of the hexagonal crystal system. In a preferred embodiment, the wurtzite structure is a gallium nitride containing crystalline material, commonly called "GaN" as used herein and outside of the present specification. In one or more specific embodiments, the wurtzite structure is characterized by tetrahedrally coordinated zinc and sulfur atoms that are stacked in an ABABAB pattern. As an example, the ZnS wurtzite structure is closely related to the structure of lonsdaleite, or hexagonal diamond, but can be others. In one or more examples, other compounds can take the wurtzite structure, including AgI, ZnO, CdS, CdSe, 2H—SiC, GaN, AN, and other semiconductors. As noted, the present method can be used in a variety of applications outside those in the optical field and can generally be used for scribing and breaking and/or separating techniques for one or more of the materials described herein.

In a specific embodiment, the present method and devices can be formed on or from bulk crystalline GaN substrate materials. The bulk GaN materials can be associated with any Group III-nitride based materials including GaN, InGaN, AlGaN, or other Group III containing alloys or compositions that are used as starting materials. Such starting materials include polar GaN substrates (i.e., substrates where the largest area surface is nominally an (h k i l) plane wherein h=k=i=0, and l is non-zero), non-polar GaN substrates (i.e., substrate material where the largest area surface is oriented at an angle ranging from about 80-100 degrees from the polar orientation described above towards an (h k i l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above towards an (h k i l) plane wherein l=0, and at least one of h and k is non-zero) according to one or more embodiments.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A laser device comprising:
   a gallium and nitrogen containing crystalline material having a nonpolar m-plane surface region;
   a laser cavity formed within a portion of the gallium and nitrogen containing crystalline material, the laser cavity being characterized by a length extending from a first end to a second opposite end;
   a first facet provided on the first end; and
   a second facet provided on the second end;
   wherein the length of the laser cavity is along a direction that is at an angle measured in degrees from a [0001] direction of the gallium and nitrogen containing crystalline material; and
   wherein the length of the laser cavity is at an angle of between about 0.3 degrees to about 30 degrees or between about −0.3 degrees to about −30 degrees from a [0001] direction of the gallium and nitrogen containing crystalline material.

2. The device of claim 1, wherein the gallium and nitrogen containing crystalline material comprises gallium nitride.

3. The device of claim 1, wherein the nonpolar m-plane surface region is an off-cut from an m-plane, within +/−10 degrees toward a c-plane, and/or within +/ −10 degrees toward an a-plane.

4. The device of claim 1, wherein the first facet and the second facet have an orientation within ±5 degrees of a {1 1 −2 6} crystallographic plane or within ±5 degrees of a {1 1 −2 6} crystallographic plane of the gallium nitride containing crystalline material.

5. The device of claim 1, wherein the first facet is substantially parallel to the second facet.

6. The device of claim 1, further comprising an active region within the laser cavity.

7. The device of claim 6, wherein the active region comprises at least a quantum well region.

8. The device of claim 1, wherein the first facet and the second facet are formed by mechanically cleaving.

9. The device of claim 1, wherein the first facet and the second facet are characterized by a surface roughness less than about 1 nm over a 25 micron square area.

10. A method of forming a laser device comprising:
    providing a gallium and nitrogen containing crystalline material having a nonpolar m-plane surface region;
    providing a laser cavity formed within a portion of the gallium and nitrogen containing crystalline material, the laser cavity being characterized by a length extending from a first end to a second opposite end;
    providing a first facet on the first end; and
    providing a second facet on the second end;
    wherein the length of the laser cavity is along a direction that is at an angle measured in degrees from a [0001] direction of the gallium and nitrogen containing crystalline material; and
    wherein the length of the laser cavity is at an angle of between about 0.3 degrees to about 30 degrees or between about −0.3 degrees to about −30 degrees from a [0001] direction of the gallium and nitrogen containing crystalline material.

11. The method of claim 10, wherein the gallium and nitrogen containing crystalline material comprises gallium nitride.

12. The method of claim 10, wherein the nonpolar m-plane surface region is an off-cut from an m-plane, within +/−10 degrees toward a c-plane, and/or within +/−10 degrees toward an a-plane.

13. The method of claim 10, wherein the first facet and the second facet have an orientation within ±5 degrees of a {1 1 −2 6} crystallographic plane or within ±5 degrees of a {1 1 −2 6} crystallographic plane of the gallium nitride containing crystalline material.

14. The method of claim 10, wherein the first facet is substantially parallel to the second facet.

15. The method of claim 10, wherein providing the first facet and providing the second facet comprises mechanically cleaving.

16. The method of claim 10, wherein the first facet and the second facet are characterized by a surface roughness less than about 1 nm over a 25 micron square area.

* * * * *